US010707413B1

(12) United States Patent
Dutta et al.

(10) Patent No.: US 10,707,413 B1
(45) Date of Patent: Jul. 7, 2020

(54) FORMATION OF EMBEDDED MAGNETIC RANDOM-ACCESS MEMORY DEVICES

(71) Applicant: International Business Machines Corporation, Armonk, NY (US)

(72) Inventors: Ashim Dutta, Menands, NY (US); Chih-Chao Yang, Glenmont, NY (US); John C. Arnold, North Chatham, NY (US); Michael Rizzolo, Delmar, NY (US); Jon Slaughter, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/368,209

(22) Filed: Mar. 28, 2019

(51) Int. Cl.
*H01L 43/12* (2006.01)
*G11C 11/16* (2006.01)
*H01L 27/22* (2006.01)
*H01L 43/08* (2006.01)
*H01L 27/12* (2006.01)

(52) U.S. Cl.
CPC .............. *H01L 43/12* (2013.01); *G11C 11/16* (2013.01); *H01L 27/1222* (2013.01); *H01L 43/08* (2013.01)

(58) Field of Classification Search
CPC ......... H01L 43/02; H01L 43/08; H01L 43/12; G11C 11/14–16; G11C 11/161
See application file for complete search history.

(56) References Cited

U.S. PATENT DOCUMENTS

| | | | |
|---|---|---|---|
| 9,166,155 B2 | 10/2015 | Deshpande et al. | |
| 9,306,157 B2 | 4/2016 | Deshpande et al. | |
| 9,564,582 B2 | 2/2017 | Pakala et al. | |
| 9,735,351 B2 * | 8/2017 | Lee | H01L 43/12 |
| 9,806,252 B2 | 10/2017 | Tan et al. | |
| 9,935,261 B1 | 4/2018 | Patel et al. | |
| 9,978,934 B2 | 5/2018 | Paranjpe et al. | |
| 9,997,562 B1 | 6/2018 | Wang et al. | |
| 10,008,387 B1 | 6/2018 | Wang et al. | |
| 10,062,837 B2 * | 8/2018 | Kim | H01L 43/08 |
| 2013/0082339 A1 | 4/2013 | Aggarwal et al. | |
| 2015/0255507 A1 | 9/2015 | Pakala et al. | |
| 2015/0380640 A1 | 12/2015 | Deshpande et al. | |

(Continued)

*Primary Examiner* — Allison Bernstein
(74) *Attorney, Agent, or Firm* — Vazken Alexanian; Ryan, Mason & Lewis, LLP

(57) ABSTRACT

Techniques are provided for fabricating magnetic random-access memory devices, which eliminate junction shorts and minimize gouging of an underlying insulating layer. For example, a bottom electrode layer, a magnetic tunnel junction (MTJ) stack, and an upper electrode layer are formed over an insulating layer. The bottom electrode layer and the MTJ stack are etched to form an upper electrode and a MTJ structure. A cleaning etch process removes residual metallic material which is re-deposited on sidewalls of the MTJ structure as a result of etching the MTJ stack. A conformal dielectric layer is formed to encapsulate the upper electrode and the MTJ structure and prevent oxidation or re-deposition of metallic material on the cleaned sidewalls of the MTJ structure. A final etch process is performed to pattern the conformal dielectric layer and bottom electrode layer to form a spacer on sidewalls of the MTJ structure and form a bottom electrode.

20 Claims, 8 Drawing Sheets

(56) References Cited

U.S. PATENT DOCUMENTS

2016/0126454 A1 5/2016 Mudivarthi et al.
2018/0019387 A1 1/2018 Tan et al.
2018/0033957 A1 2/2018 Zhang et al.

\* cited by examiner

100

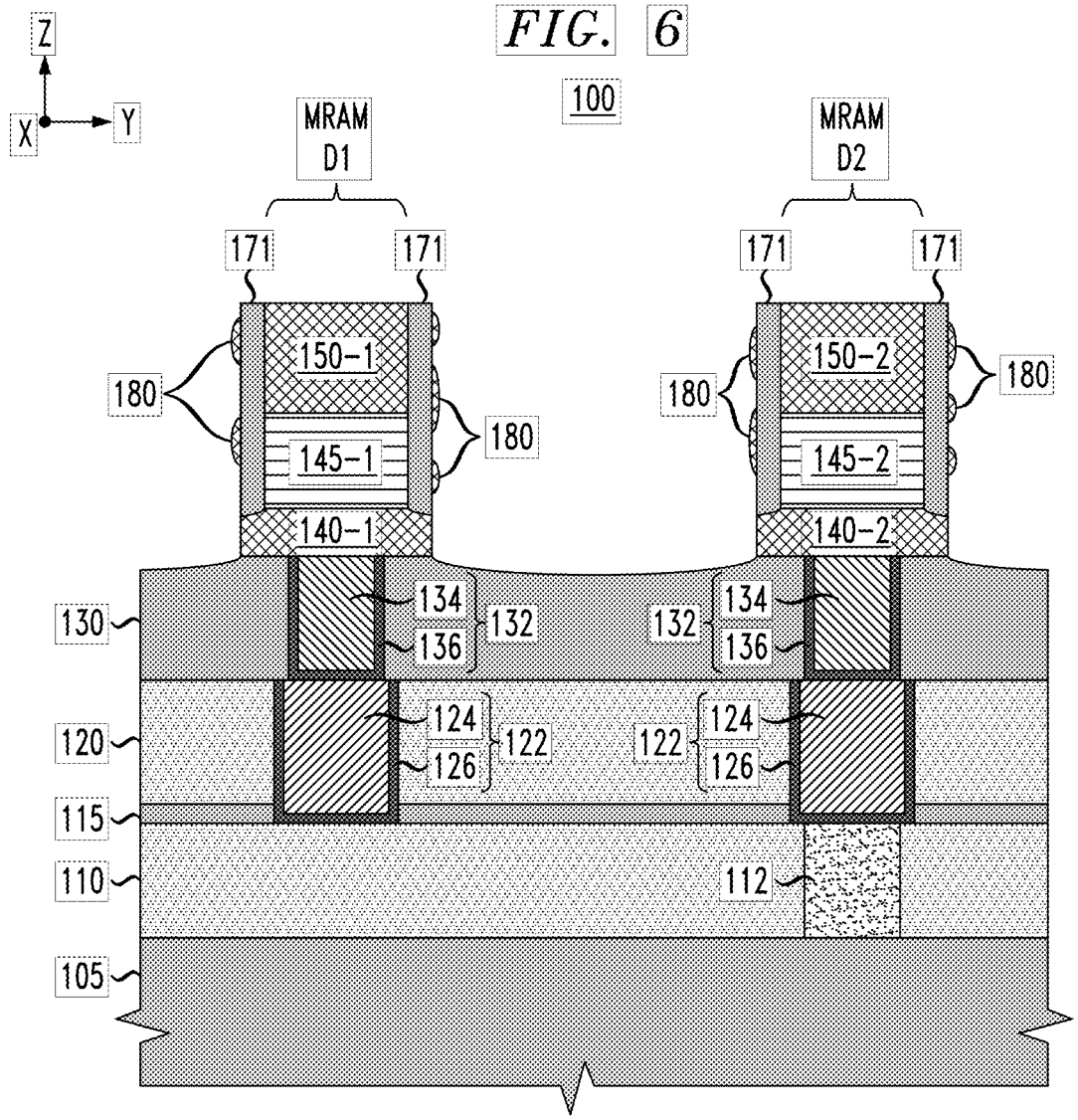

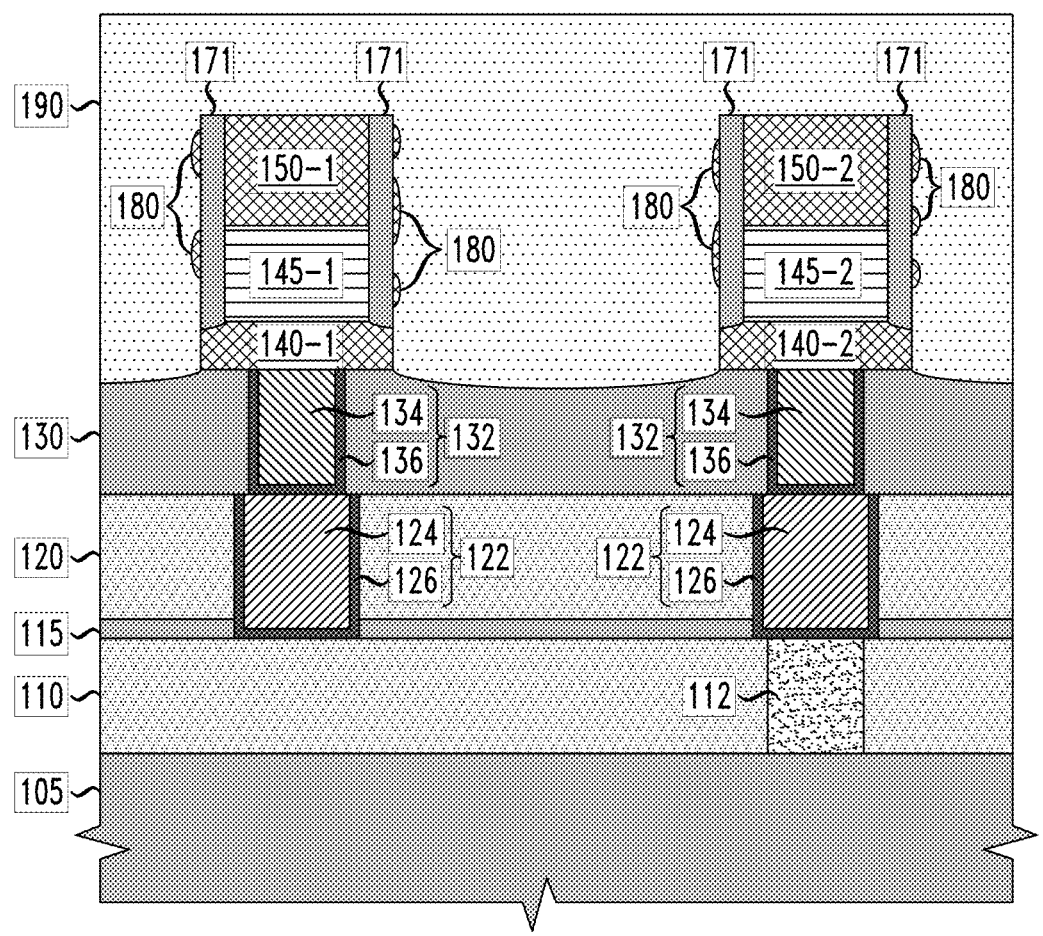

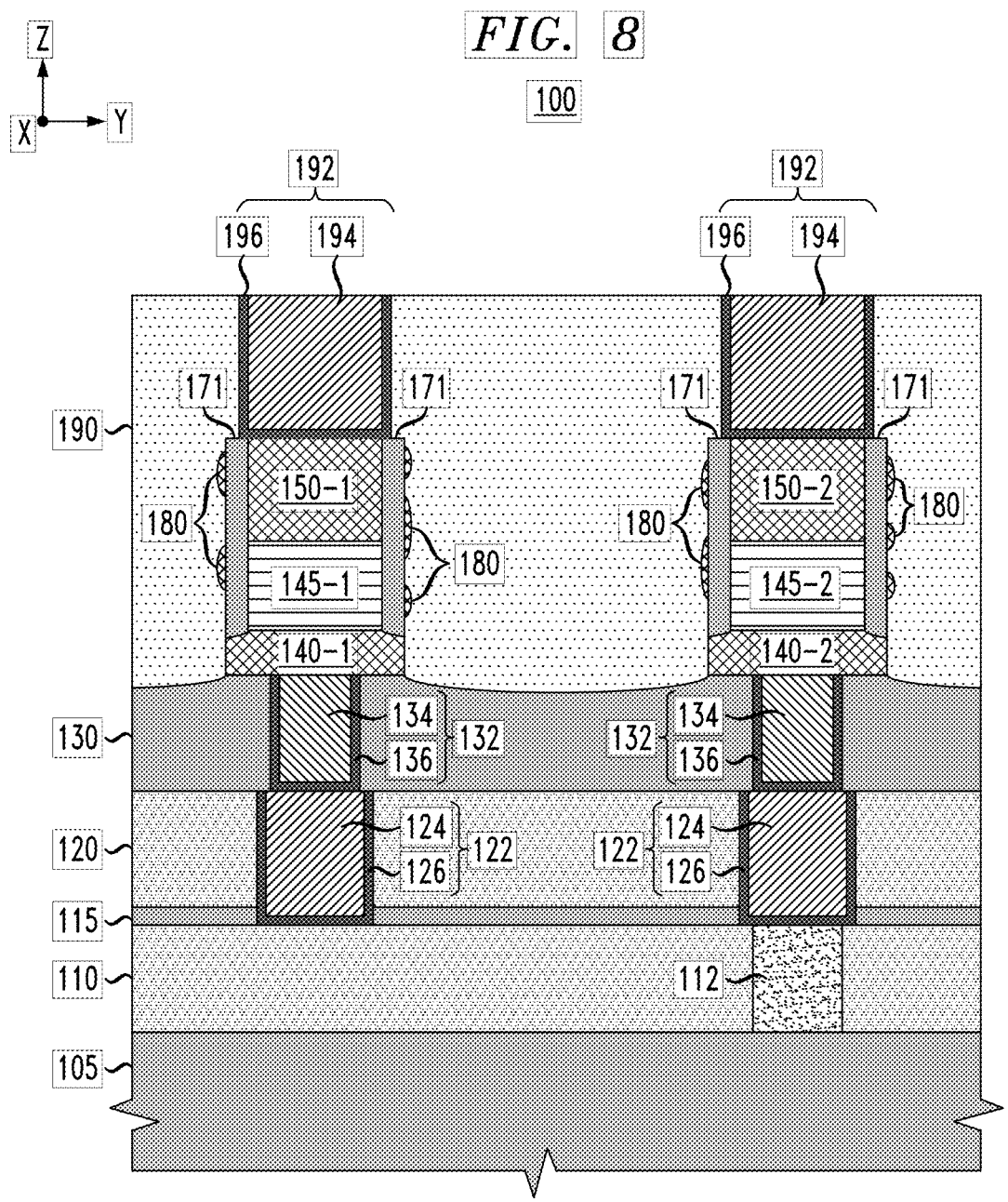

FORMATION OF EMBEDDED MAGNETIC RANDOM-ACCESS MEMORY DEVICES

TECHNICAL FIELD

This disclosure relates generally to semiconductor fabrication techniques and, in particular, methods for fabricating embedded magnetic random-access memory (MRAM) devices within, e.g., a back-end-of-line (BEOL) structure.

BACKGROUND

Spin-transfer torque magnetic random-access memory (STT-MRAM) is a type of solid state, non-volatile memory that uses tunneling magnetoresistance (TMR) to store information. A MRAM system comprises an electrically connected array of magnetoresistive memory elements, referred to as magnetic tunnel junctions (MTJs). As is known in the art, a basic structure of a magnetic tunnel junction includes two thin ferromagnetic layers separated by a thin insulating layer through which electrons can tunnel. The spin-transfer torque (STT) phenomenon is realized in a MTJ structure, wherein one ferromagnetic layer (referred to as "magnetic free layer") has a non-fixed magnetization, and the other ferromagnetic layer (referred to as a "magnetic pinned layer", or "reference layer") has a "fixed" magnetization. A MTJ stores information by switching the magnetization state of the magnetic free layer. When the magnetization direction of the magnetic free layer is parallel to the magnetization direction of the reference layer, the MTJ is in a "low resistance" state. Conversely, when the magnetization direction of the free layer is antiparallel to the magnetization direction of the reference layer, the MTJ is in a "high resistance" state. A magnetic tunnel structure can be fabricated with multiple magnetic, conductive and/or insulting layers, depending on the given application. For example, additional stacked layers may include two or more magnetic layers and two or more tunnel barrier layers, and other layers that are commonly implemented to construct other types of magnetic tunnel junction structures, e.g., double magnetic tunnel junction structures.

Conventional methods for fabricating embedded MRAM devices can lead to degraded performance of MRAM devices. For example, conventional methods for fabricating MRAM devices typically utilize a single etch process to etch a MTJ layer stack and bottom electrode layer down to an underlying dielectric layer to thereby form a MTJ structure and bottom electrode. With this etch process, an over-etch is performed to properly pattern the bottom electrode layer, which results in gouging of the underlying dielectric layer. In this instance, residual metallic material is re-deposited on the sidewalls of the MTJ structure (as a result of the etching of the MTJ layer stack and the bottom electrode layer), and residual dielectric material is re-deposited over the residual metallic material on the sidewalls of the MTJ structure (as a result of the etching of the underlying dielectric layer). The residual metallic material that is re-deposited on the sidewalls of the MTJ structure can result in junction shorts between metallic/magnetic layers within the MTJ structure.

While a cleaning etch process can be utilized to clean the residual material from the sidewalls of the MTJ structures, the cleaning etch process can be problematic as it is difficult to remove the metallic residue from the sidewalls of the MTJ structure with the metallic residue covered by the dielectric residue from the etching of the underlying dielectric layer. As such, the cleaning etch process must be performed for relatively long period of time and at a relatively high power to effectively remove the residual metallic material from the sidewalls of the MTJ structure. However, the cleaning etch process leads to further etching/gouging of the exposed surface of the underlying dielectric layer, which can lead to removal of the dielectric material in open areas outside the MRAM array and exposing metallic wiring of a lower interconnect level of a BEOL structure.

SUMMARY

Embodiments of the invention include methods for fabricating magnetic random-access memory devices. For example, in one exemplary embodiment, an insulating layer is formed over a substrate, a bottom electrode layer is formed over the insulating layer, a magnetic tunnel junction layer stack is formed over the bottom electrode layer, and an upper electrode layer is formed over the magnetic tunnel junction layer stack. The upper electrode layer is etched to form an upper electrode. The magnetic tunnel junction layer stack is etched down to the bottom electrode layer to form a magnetic tunnel junction structure with the upper electrode disposed over the magnetic tunnel junction structure. A cleaning etch process is performed to remove residual material which is redeposited on sidewalls of the magnetic tunnel junction structure and the upper electrode, as a result of the etching of the magnetic tunnel junction layer stack. An insulating spacer is formed on the sidewalls of the magnetic tunnel junction structure and the upper electrode, subsequent to performing the cleaning etch process. The bottom electrode layer is etched down to the first insulating layer to form a bottom electrode that is disposed below the magnetic tunnel junction structure. The bottom electrode, the magnetic tunnel junction structure, and the upper electrode form a magnetic random-access memory device.

In another exemplary embodiment, an interlayer dielectric layer is formed over a substrate, a first electrode contact is formed in the interlayer dielectric layer, and a magnetic random-access memory layer stack is formed over the interlayer dielectric layer. The magnetic random-access memory layer stack comprises a bottom electrode layer disposed over the interlayer dielectric layer, a magnetic tunnel junction layer stack disposed over the bottom electrode layer, and an upper electrode layer disposed over the magnetic tunnel junction layer stack. A first etch process is performed to etch the upper electrode layer down to the magnetic tunnel junction layer stack and thereby form an upper electrode. A second etch process is performed to etch the magnetic tunnel junction layer stack down to the bottom electrode layer and thereby form a magnetic tunnel junction structure with the upper electrode disposed over the magnetic tunnel junction structure. A cleaning etch process is performed to remove residual material which is redeposited on sidewalls of the magnetic tunnel junction structure and the upper electrode, as a result of the second etch process. Subsequent to the cleaning etch process, a conformal dielectric layer is deposited which conformally covers the magnetic tunnel junction structure, the upper electrode, and an exposed surface of the bottom electrode layer. A third etch process is performed to etch the conformal dielectric layer and the exposed surface of the bottom electrode layer down the interlayer dielectric layer to thereby form an insulating spacer and a bottom electrode, wherein the insulating spacer is disposed on sidewalls of the magnetic tunnel junction structure and the upper electrode, and wherein the bottom electrode is aligned to, and in contact with, the first electrode contact. The bottom electrode, the magnetic tunnel junction structure, and the upper electrode form a magnetic random-access memory device.

Another exemplary embodiment includes a device. The device comprises a magnetic random-access memory device disposed within a back-end-of line structure. The magnetic random-access memory device comprises a bottom electrode, a magnetic tunnel junction structure disposed on the bottom electrode, an upper electrode disposed on the magnetic tunnel junction structure, and an insulating spacer disposed on sidewalls of the magnetic tunnel junction structure and the upper electrode. The bottom electrode extends below the insulating spacer. An interface between the insulating spacer and the magnetic tunnel junction structure is devoid of metallic residue.

Other embodiments will be described in the following detailed description of embodiments, which is to be read in conjunction with the accompanying figures.

BRIEF DESCRIPTION OF THE DRAWINGS

FIGS. 1 through 8 schematically illustrate a method for fabricating embedded MRAM devices according to an embodiment of the invention, wherein:

FIG. 1 is a schematic cross-sectional side view of a semiconductor integrated circuit (IC) device at an intermediate stage of fabrication in which electrode layers and a MTJ layer stack for embedded MRAM devices are formed in a back-end-of-line (BEOL) structure;

FIG. 2 is a schematic cross-sectional side view of the device shown in FIG. 1 after performing an anisotropic dry etch process to pattern a hardmask layer and an upper electrode layer to thereby form individual upper electrodes and hardmask capping layers on the upper electrodes;

FIG. 3 is a schematic cross-sectional side view of the device shown in FIG. 2 after patterning an exposed portion of the MTJ layer stack to form individual MTJ structures;

FIG. 4 is a schematic cross-sectional side view of the device shown in FIG. 3 after performing a cleaning etch process to remove residual metallic material from sidewalls of the MTJ structures;

FIG. 5 is a schematic cross-sectional side view of the device shown in FIG. 4 after forming a conformal dielectric layer to encapsulate the MTJ structures and the upper electrodes;

FIG. 6 is a schematic cross-sectional side view of the device shown in FIG. 5 after patterning the conformal dielectric layer and a bottom electrode layer to form dielectric sidewall spacers on sidewalls of the MTJ structures and the upper electrodes, and to form individual bottom electrodes below the MTJ structures;

FIG. 7 is a schematic cross-sectional side view of the device shown in FIG. 6 after forming an interlayer dielectric (ILD) layer to encapsulate the embedded MRAM devices; and FIG. 8 is a schematic cross-sectional side view of the device shown in FIG. 7 after forming upper electrode contacts in the ILD layer, which are in contact with the upper electrodes of the embedded MRAM devices.

DETAILED DESCRIPTION

Figure 1:
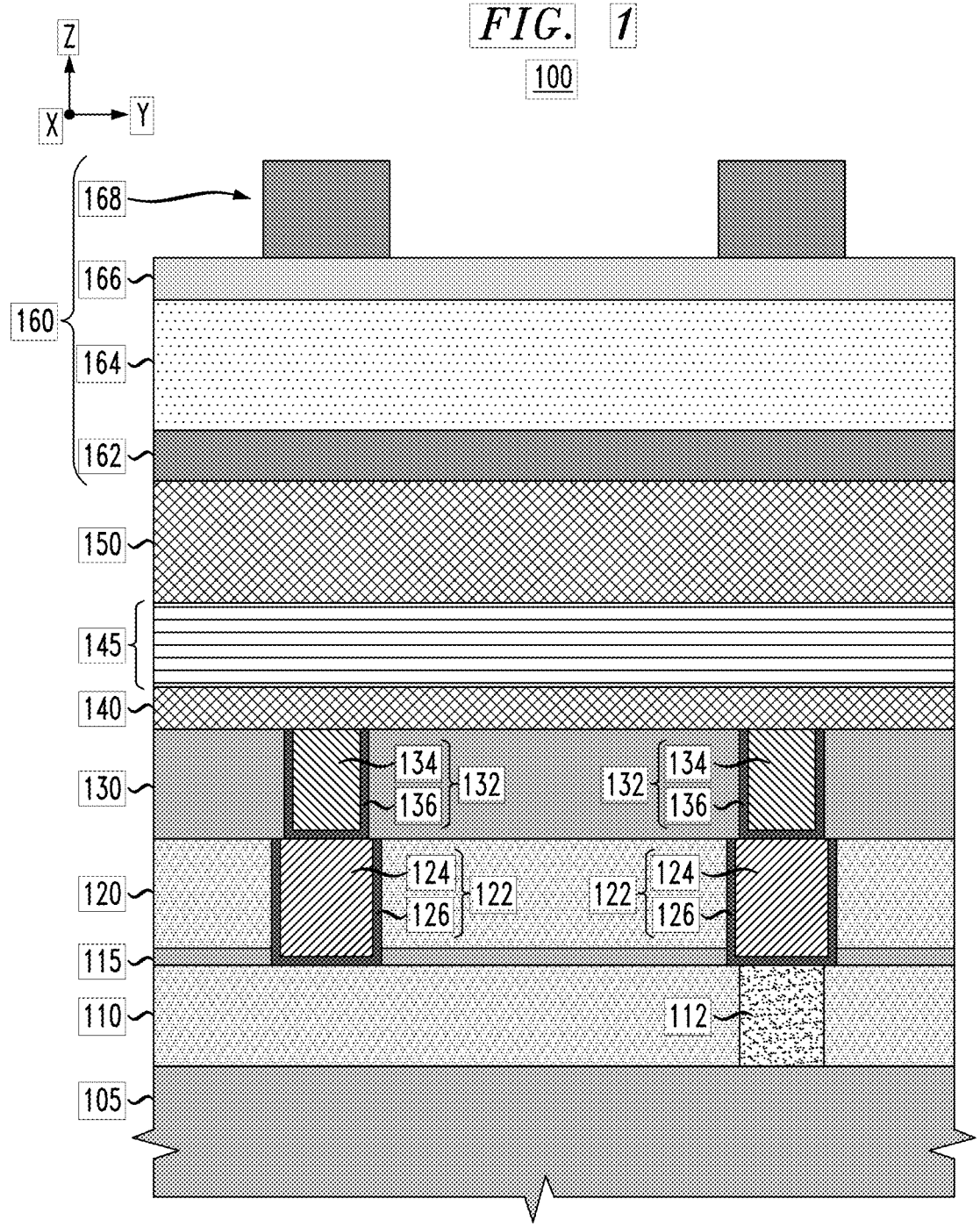

Embodiments of the invention will now be described in further detail with regard to methods for fabricating embedded MRAM devices, which eliminate magnetic tunnel junction shorts and minimize gouging of an underlying dielectric layer on which the MRAM devices are formed. For example, as explained in further detail below, methods for fabricating an embedded MRAM device generally comprise forming an MRAM layer stack over a dielectric layer (e.g., ILD layer of a BEOL structure), wherein the MRAM stack comprises a bottom electrode layer, a MTJ layer stack, and an upper electrode layer. The bottom electrode layer and the MTJ layer stack are patterned using one or more etch process to thereby form an upper electrode and a MTJ structure. The etching of the MTJ layer stack to form the MTJ structure terminates at the bottom electrode layer. Following the etching of the MTJ layer stack, a cleaning etch process is performed to remove residual metallic material which is re-deposited on the sidewalls of the MTJ structure as a result of etching the MTJ stack. A conformal dielectric layer is then formed to encapsulate the upper electrode and MTJ structure. The conformal dielectric layer prevents oxidation or re-deposition of metallic or dielectric material on the cleaned sidewalls of the MTJ structure during a final etch process which is performed to pattern the conformal dielectric layer and the bottom electrode layer to thereby form a dielectric sidewall spacer on the sidewalls of the MTJ structure and upper electrode, and a bottom electrode. During the final etch process, residual metallic and/or dielectric material is re-deposited on the dielectric sidewall spacer, and not on the sidewalls of the MTJ structure. Various methods for fabricating embedded MRAM devices according to exemplary embodiments of the invention will be discussed in further detail below with reference to the process flow that is schematically illustrated in FIGS. 1 through 8.

It is to be understood that the various layers, structures, and regions shown in the accompanying drawings are schematic illustrations that are not drawn to scale. In addition, for ease of explanation, one or more layers, structures, and regions of a type commonly used to form semiconductor IC devices or structures may not be explicitly shown in a given drawing. This does not imply that any layers, structures, and regions not explicitly shown are omitted from the actual semiconductor IC device structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor IC devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

The term "exemplary" as used herein means "serving as an example, instance, or illustration". Any embodiment or design described herein as "exemplary" is not to be construed as preferred or advantageous over other embodiments or designs. The word "over" as used herein to describe forming a feature (e.g., a layer) "over" a side or surface, means that the feature (e.g. the layer) may be formed "directly on" (i.e., in direct contact with) the implied side or surface, or that the feature (e.g., the layer) may be formed "indirectly on" the implied side or surface with one or more additional layers disposed between the feature (e.g., the layer) and the implied side or surface.

To provide spatial context to the different structural orientations of the semiconductor IC device structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

FIGS. 1 through 8 schematically illustrate a method for fabricating embedded MRAM devices according to an embodiment of the invention. For purposes of illustration, FIGS. 1 through 8 schematically illustrate methods for embedded MRAM devices within a BEOL structure. FIG. 1 is a schematic cross-sectional side view of a semiconductor integrated circuit (IC) device 100 at an intermediate stage of fabrication in which electrode layers and a MTJ layer stack for embedded MRAM devices are formed in a BEOL structure, according to an embodiment of the invention. In particular, FIG. 1 schematically illustrates a semiconductor IC device 100 comprising a semiconductor substrate 105, a first insulating layer 110, a device contact 112 formed in the first insulating layer 110, a dielectric capping layer 115, a second insulating layer 120, metallization structures 122 disposed in the second insulting layer 120, a third insulating layer 130, bottom electrode contacts 132 formed in the third insulating layer 130, a bottom electrode layer 140, a MTJ layer stack 145, an upper electrode layer 150, and a lithographic stack 160. The lithographic stack 160 comprises a hardmask layer 162, a planarizing layer 164, an anti-reflection coating (ARC) 166, and a patterned photoresist layer 168. It is to be noted that in each drawing of FIGS. 1-8, the X-Y plane represents a plane that is parallel to the plane of the semiconductor substrate 105 being processed. The intermediate device structure shown in FIG. 1 can be fabricated using known materials and techniques.

For example, while the substrate 105 is generically depicted for ease of illustration, it is to be understood that the substrate 105 comprises multiple layers including a semiconductor wafer substrate layer, a front-end-of-line (FEOL) layer formed on the semiconductor wafer substrate, and a middle-of-the-line (MOL) layer formed on the FEOL layer. The semiconductor wafer substrate comprises one of different types of semiconductor wafer substrate structures and materials. For example, in one embodiment, the semiconductor wafer substrate can be a bulk semiconductor wafer substrate that is formed of silicon (Si) or germanium (Ge), or other types of semiconductor substrate materials which are commonly used in bulk semiconductor fabrication processes such as a silicon-germanium alloy, compound semiconductor materials (e.g. III-V), etc. In another embodiment, the semiconductor wafer substrate may comprise an SOI (silicon-on-insulator) substrate, GeOI (germanium-on-insulator) substrate, or other types of semiconductor-on-insulator substrates which comprise an insulating layer (e.g., oxide layer) disposed between a base substrate layer (e.g., silicon substrate) and the active semiconductor layer (e.g., Si, Ge, etc.) in which active circuit components are formed as part of the FEOL.

The FEOL layer comprises various semiconductor devices and components that are formed in or on an active surface of the semiconductor wafer substrate to provide integrated circuitry for a target application. For example, the FEOL layer comprises field-effect transistor (FET) devices (such as FinFET devices, vertical FET devices, planar FET devices, etc.), bipolar transistors, diodes, capacitors, inductors, resistors, isolation devices, etc., which are formed in or on the active surface of the semiconductor wafer substrate. In general, FEOL processes typically include preparing the semiconductor wafer substrate, forming isolation structures (e.g., shallow trench isolation), forming device wells, patterning gate structures, forming spacers, forming source/drain regions (e.g., via implantation), forming silicide contacts on the source/drain regions, forming stress liners, etc. The MOL layer comprises a PMD (pre-metal dielectric layer) and conductive contacts (e.g., source/drain contacts, gate contacts, etc.) that are formed in the PMD layer. The PMD layer is formed on the components and devices of the FEOL layer. The conductive contacts of the MOL layer provide electrical connections between the integrated circuitry of the FEOL layer and a first level of metallization of a BEOL structure that is formed over the FEOL/MOL layers.

In the exemplary embodiment of FIG. 1, it is assumed for illustrative purposes that the first insulating layer 110 is formed as part of an MOL layer and that the device contact 110 comprises a vertical via contact that serves as a contact between a logic device in the FEOL layer and the BEOL layer. The first insulating layer 110 can be formed of a dielectric material including, but not limited to, silicon oxide (e.g. $SiO_2$), silicon nitride (e.g., $Si_3N_4$), a hybrid silica-based low-k dielectric material such as carbon-doped silicon glass (e.g., carbon-doped silicon glass (SiCOH) or organosilicate glass (SOG)), SiCH, SiCNH, etc.), a fluorinated silicon glass (FSG), a low-k porous dielectric material (k less than about 3.9), or an ULK (ultra-low-k) dielectric material (with k less than about 2.5 etc.), wherein "k" denotes a relative dielectric constant. The first insulating layer 110 may be deposited using known deposition techniques, such as, for example, ALD (atomic layer deposition), CVD (chemical vapor deposition) PECVD (plasma-enhanced CVD), or PVD (physical vapor deposition), or spin-on deposition, or other deposition techniques that are suitable to form low-k or medium-k dielectric layers for MOL layers.

In some embodiments, the device contact 112 comprises a MOL device contact (e.g., vertical source/drain via contact, vertical gate contact, etc.) which provides a contact between a device (e.g., FET device) in the FEOL layer and wiring in a first BEOL metal level. While the MOL device contact 112 is generically illustrated throughout the figures, it is to be understood that the MOL device contact 112 is formed using known methods and materials. For example, the MOL device contact 112 can be formed by a process which comprises etching a contact opening in the first insulating layer 110, lining the contact opening with a liner layer which comprises one or more diffusion barrier layers (e.g., titanium and/or titanium nitride) and seed layers, filling the contact opening with a metallic material (e.g., tungsten, cobalt, ruthenium, etc.) and performing a chemical-mechanical polishing (CMP) process to remove overburden metallic and liner materials on the upper surface of the first insulating layer 110.

The capping layer 115 is formed by depositing a layer of dielectric material over the planarized surface of the first insulating layer 110. The capping layer 115 comprises a dielectric material that serves to prevent diffusion/electromigration of metallic material from the MOL device contacts (formed in the first insulating layer 110) into the second insulating layer 120. The capping layer 115 can be formed of dielectric materials such as silicon nitride (SiN), silicon boron carbon nitride (SiBCN), silicon carbide (SiC), nitrogen-doped SiC (e.g., silicon carbonitride (SiCN)), hydrogen-doped SiC (e.g., amorphous silicon carbon hydrogen (a-Si:C:H)), and other types of dielectric materials commonly used to form capping layers in MOL/BEOL layers.

In the exemplary embodiment of FIG. 1, it is assumed for illustrative purposes that the second insulating layer 120 comprises a first ILD layer that is formed as part of a first BEOL metal level over the capping layer 115. The second insulating layer 120 can be formed using the same or similar materials and methods as the first insulating layer 110, as discussed above. The metallization structures 122 are formed as part of, e.g., the first metal layer of the BEOL structure, wherein the metallization structures 122 may comprises metal wiring. The metallization structures 122 comprise metal lines 124 and liner layers 126, which are formed using known methods. For example, the second insulating layer 120 is patterned to form openings (e.g., trenches, vias, etc.) using suitable damascene patterning methods. A conformal layer of liner material which forms the liner layers 126 is then deposited over the patterned surface of the second insulating layer 120 to line the sidewall and bottom surfaces of the etched openings in the second insulating layer 120. The liner material serves as a diffusion barrier layer which can include materials that are commonly used as diffusion barrier layers for copper interconnects including, but not limited to, titanium (Ti), tantalum (Ta), titanium nitride (TiN), tantalum nitride (TaN), cobalt (Co), etc. In addition, the liner layers 126 may comprise a thin seed layer to serve as a wetting or adhesion layer for the deposition of the metallic material which fills the etched openings to form the metal lines 124.

A layer of metallic material is then deposited to fill the etched openings in the second insulating layer 120 with metallic material that forms the metal lines 124. In one embodiment, the layer of metallic material comprises copper, which is deposited using any suitable copper deposition method. The layer of metallic material can be deposited using any suitable wet or dry deposition method. A CMP process is then performed to remove overburden portions of the liner layer, seed layer, and metallic layer down to the upper surface of the second insulating layer 120.

The third insulating layer 130 is formed by depositing a layer of dielectric material over the planarized surface of the second insulating layer 120. In some embodiments, the third insulating layer 130 is formed of the same or similar material as the capping layer 115. For example, the third insulating layer 130 is formed of dielectric materials such as SiN, SiBCN, SiC, SiCN, SiCH, or other types of dielectric material which are suitable for the given application. The thickness of the third insulating layer 130 defines the vertical height of the bottom electrode contacts 132 that are formed in the third insulating layer. For example, in some exemplary embodiments, the third insulating layer 130 can be formed with a thickness in a range of about 100 nm to about 200 nm.

The bottom electrode contacts 132 each comprise a metallic via 134 and a liner layer 136. The metallic via 134 can be formed of conductive material such as tantalum (Ta), tantalum nitride (TaN), titanium (Ti), titanium nitride (TiN), copper (Cu), ruthenium (Ru), tungsten (W), etc., or other types of metallic material which is suitable for the given application. The liner layers 136 can be formed using one more layers of material that serve as a diffusion barrier layer and/or seed layer, such as TiN, TaN, Co, Ru, etc.

The bottom electrode layer 140, the MTJ layer stack 145, and the upper electrode layer 150 are patterned to form individual MRAM devices, wherein each MRAM device comprises a MTJ structure disposed between upper and lower electrodes. The bottom electrode layer 140 and the upper electrode layer 150 can be formed of the same or similar materials that are used to form the bottom electrode contacts 132. For example, the bottom electrode layer 140 and the upper electrode layer 150 can be formed by depositing a layer of metallic material such as TaN, TiN, W, or other types of metallic material which are suitable for use as bottom electrodes for MRAM devices. In some exemplary embodiments, the bottom electrode layer 140 has a thickness in range of about 5 nm to about 100 nm, and the upper electrode layer 150 has a thickness in a range of about 100 nm to about 200 nm.

The MTJ layer stack 145 is formed of a plurality of metallic and insulating layers which form, e.g., magnetic pinned layer(s), magnetic free layer(s), tunnel barrier layer (s), etc., depending on the MTJ structure that is used to implement MRAM devices. For example, a magnetic pinned layer may comprise a layer of magnetic material such as cobalt (Co), iron (Fe), boron (B), or any combination thereof (e.g., CoFeB or CoFe). A tunnel barrier layer may comprise a non-magnetic, insulating material such as magnesium oxide (MgO), aluminum oxide (AlO), titanium oxide (TiO), germanium oxide (GeO), strontium titanate (SrTiO$_3$), or any other suitable materials. A free magnetic layer may comprise a magnetic material such as iron, or a magnetic material including at least one of cobalt or iron or nickel, or any combination thereof. It is to be understood that while FIG. 1 generically depicts the MTJ layer stack 145, the number and arrangement of magnetic, metallic, and insulating layers that form the MTJ layer stack 145 will vary depending on the target MTJ architecture for MRAM devices to be formed in the BEOL layer.

The lithographic stack 160 is utilized to pattern the upper electrode layer 150 and the MTJ layer stack 145, using a process flow as described in further detail below. In some exemplary embodiments, the hardmask layer 162 is formed by depositing a layer of hardmask material (e.g., silicon nitride, silicon oxide, etc.) on the upper electrode layer 150. The planarizing layer 164 may comprise an organic planarizing layer (OPL) (e.g., organic polymer) or an organic dielectric layer (ODL), spin-on-carbon (SOC) layer or any other type of material which is self-leveling and achieves planarization over the surface topography without the use of etching, chemical mechanical polishing, or other conventional planarization techniques. In one exemplary embodiment, the planarizing layer 164 comprises an organic planarization material, which is a self-planarizing organic material that includes carbon, hydrogen, oxygen, and optionally nitrogen, fluorine, and silicon. The self-planarizing organic material can be a polymer with sufficiently low viscosity so that the top surface of the applied polymer forms a planar horizontal surface. The planarizing layer 164 is formed by spin-coating, and has a thickness in a range of about 50 nm to about 500 nm.

The ARC layer 166 is utilized to reduce reflection of light from a layer to be etched during exposure of a photoresist layer formed over the ARC layer 166, which is patterned to form the photoresist pattern 168. The ARC layer 166 may comprise an organic or inorganic anti-reflection coating. In one exemplary embodiment, the ARC layer 166 comprises a silicon ARC (Si-ARC) layer. The photoresist pattern 168 is formed by depositing (e.g., spin coating) a layer of photoresist material over the ARC layer 166, and then exposing and developing the layer of photoresist material to form the photoresist pattern 168. In some embodiments, the thickness of the photoresist layer is in a range of about 20 nm to about 800 nm, although lesser and greater thicknesses can also be employed. The photoresist layer can be a layer of a photoresist material that is sensitive to deep-ultraviolet (DUV) radiation, extreme ultraviolet (EUV), or mid-ultraviolet (MUV) radiation as known in the art, or the photoresist layer can be an e-beam resist material that is sensitive to radiation of energized electrons.

Figure 2:
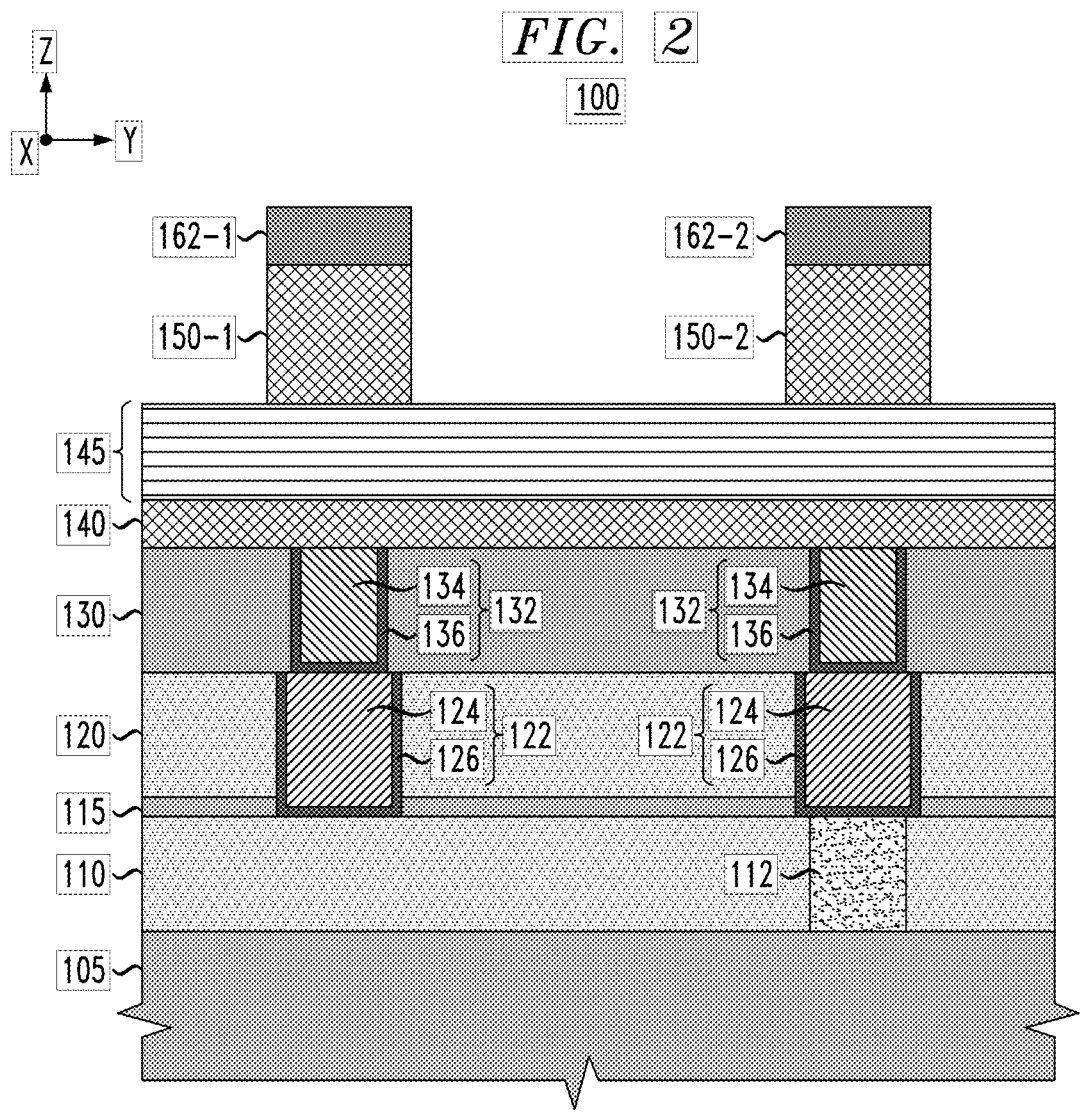
Figure 3:
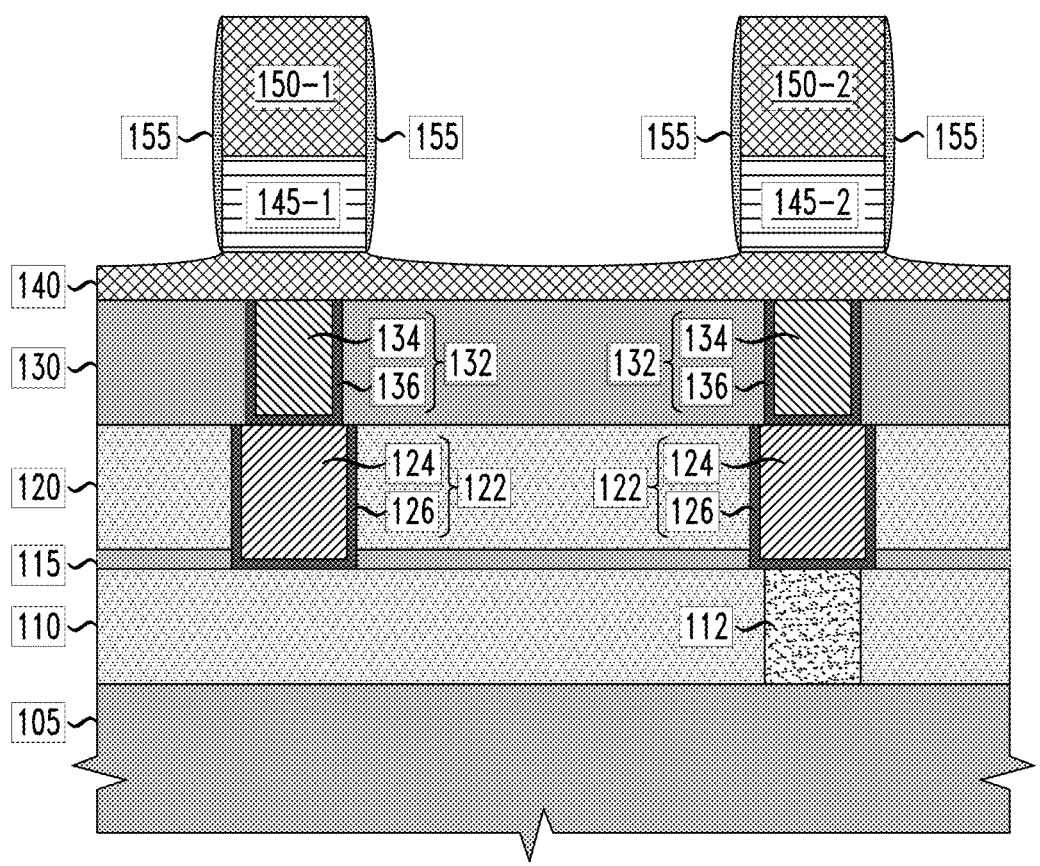

The resulting photoresist pattern 168 as shown in FIG. 1 comprises an image that is transferred into the upper electrode layer 150 and the MTJ layer stack 145 using a process flow as schematically illustrated in FIGS. 2 and 3. In particular, FIG. 2 is a schematic cross-sectional side view of the device shown in FIG. 1 after performing an anisotropic dry etch process to pattern the hardmask layer 162 and the upper electrode layer 150 to thereby form individual upper electrodes 150-1 and 150-2 and hardmask capping layers 162-1 and 162-2. In one embodiment, the etch process is performed using a directional reactive ion etch (RIE) process to etch down the exposed portions of the ARC layer 166, the planarizing layer 164, the hardmask layer 162, and the upper electrode layer 150 down to the MTJ layer stack 145. During the RIE process, the photomask 168 and the ARC layer 166 are fully consumed, and the planarizing layer 164 is fully or partially consumed. Following the etch process, any remaining portion of the patterned planarizing layer 164 on top of the hardmask capping layers 162-1 and 162-2 is removed by an ashing process, resulting in the intermediate device structure shown in FIG. 2.

Next, FIG. 3 is a schematic cross-sectional side view of the device shown in FIG. 2 after patterning the exposed portion of the MTJ layer stack 145 to form individual MTJ structures 145-1 and 145-2. In one exemplary embodiment, the MTJ layer stack 145 is patterned by performing an ion beam etch (IBE) process (or Milling process) to etch the exposed portion of the MTJ layer stack 145 down to the bottom electrode layer 140. The IBE process is a dry plasma etch method which utilizes a remote broad beam ion/plasma source to etch the target materials by means of a physical inert gas and/or a chemical reactive gas. The ion bombardment of the substrate is well defined and controlled, wherein the IBE process measures and controls various material etch parameters, such as ion energy, ion current density, and ion incidence angle. The ion incidence angle is achieved by tilting the substrate stage to a target angle, and the etching of the substrate is achieved by rotating the tilted substrate stage. In some exemplary embodiments, IBE process to etch the MTJ layer stack 145 is performed at an angle in a range of about 30° to about 60°.

In some embodiments, the IBE process to etch the MTJ layer stack 145 is a non-selective etch process such that the IBE process results in the removal of the hardmask layers 162-1 and 162-2 as well as a slight gouging (etching) of the upper surface of the lower electrode layer 140, and potentially a slight recessing of the upper electrodes 150-1 and 150-2. While it is ideal to terminate the IBE process when reaching the bottom electrode layer 140, an over-etch is performed to ensure that the exposed portion of the MTJ layer stack 145 is completely removed, which results in slight recessing/gouging of the upper surface of the bottom electrode layer 140 when the IBE etch is non-selective, as schematically illustrated in FIG. 3. However, in contrast to conventional methods which concurrently pattern a MTJ layer stack and bottom electrode layer using a continuous etch process, exemplary embodiments of the invention implement a process flow in which the bottom electrode layer 140 is patterned using a subsequent etch process, which is separate from the IBE process (FIG. 3) to pattern the MTJ layer stack 145.

In addition, as further illustrated in FIG. 3, the IBE process results in the formation of residual metallic material 155 on the sidewalls of the MTJ structures 145-1 and 145-2. The residual metallic material 155 is formed as a result of the re-deposition of metallic material during the ion beam etching of the metallic layers of the MTJ layer stack 145 and the slight etching of the metallic materials of the upper electrodes 150-1 and 150-2 and the bottom electrode layer 140. The residual metallic material 155 on the sidewalls of the MTJ structures 145-1 and 145-2 can cause shorts between the metallic layers of the MTJ structures 145-1 and 145-2. Accordingly, an etch process is performed to clean the metallic residue from the sidewalls of the MTJ structures 145-1 and 145-2.

Figure 4:
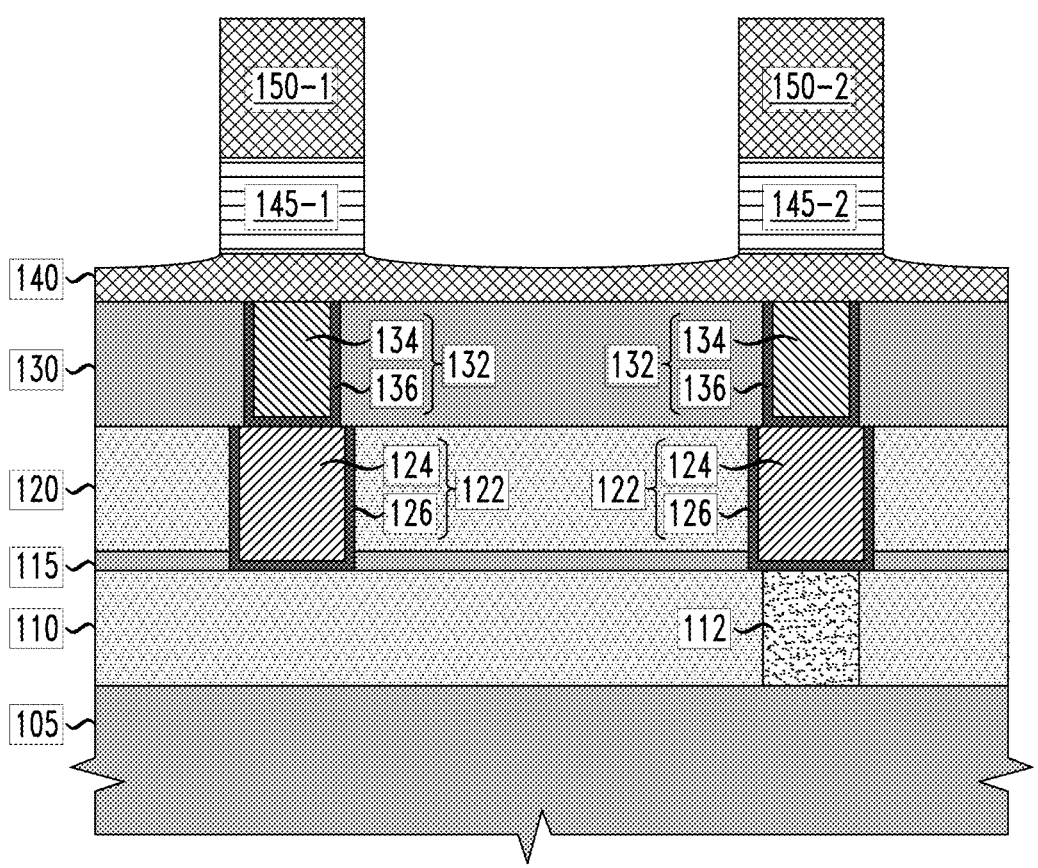

For example, FIG. 4 is a schematic cross-sectional side view of the device shown in FIG. 3 after performing a cleaning etch process to remove the residual metallic material 155 from the sidewalls of the MTJ structures 145-1 and 145-2. In some embodiments, the cleaning etch process is performed using an IBE process which is configured to selectively remove the residual metallic material 155 from the sidewalls of the MTJ structures 145-1 and 145-2 while preventing or minimizing recessing/etching of the bottom electrode layer 140 and the upper electrode 150-1 and 150-2. In one embodiment, selective removal of the residual metallic material 155 is performed using an IBE clean-up process which is configured with a lower ion energy (e.g., voltage) and increased ion incidence angle of about 60° and or greater (as compared to the initial IBE process parameters for etching the MTJ layer stack 145). The IBE clean-up process removes the residual metallic material 155 from the sidewalls of the MTJ structures 145-1 and 145-2 and the sidewalls of the upper electrodes 150-1 and 150-2, without etching the bottom electrode layer 140 resulting in the intermediate device structure schematically illustrated in FIG. 4.

Figure 5:
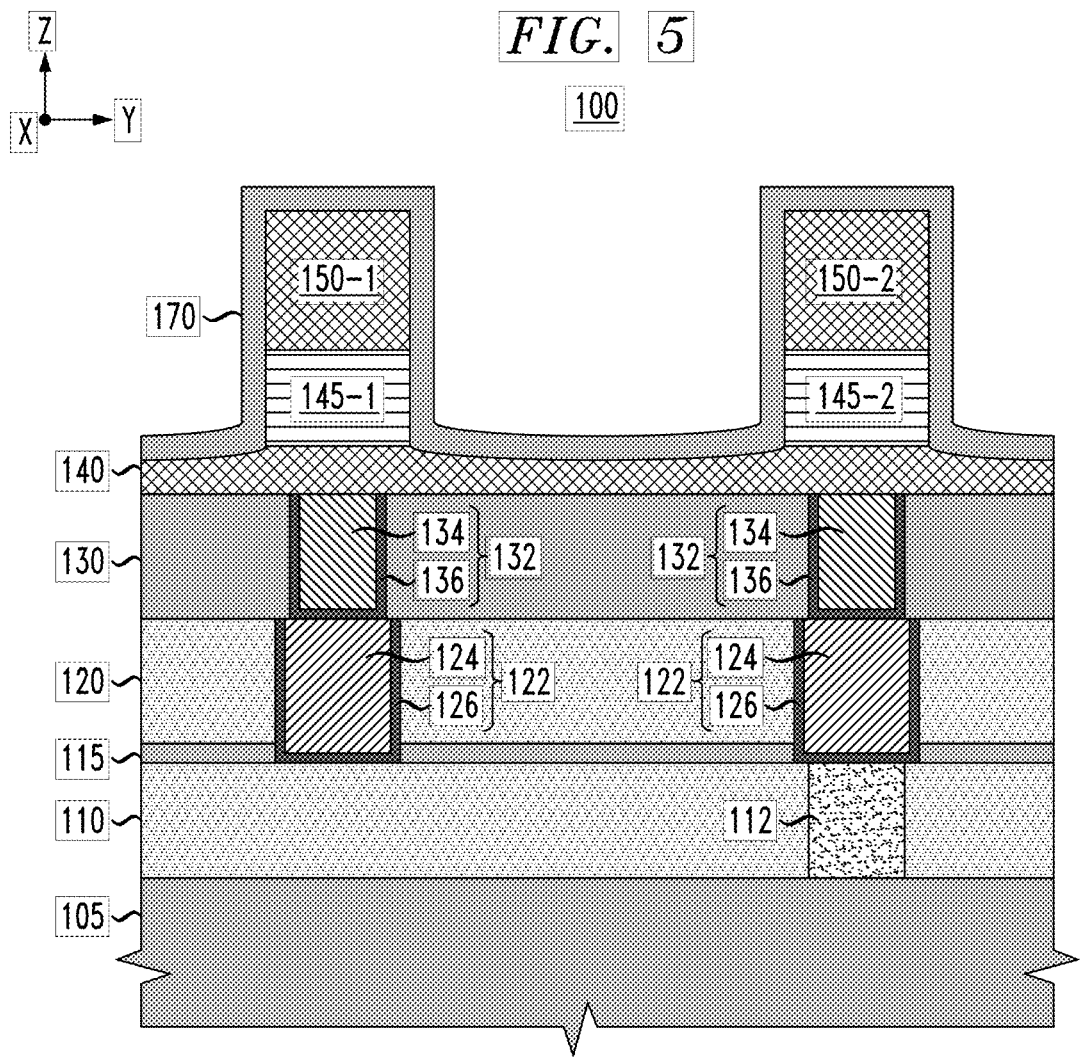

Next, FIG. 5 is a schematic cross-sectional side view of the device shown in FIG. 4 after forming a conformal dielectric layer 170 (or conformal encapsulating layer 170) to encapsulate the MTJ structures 145-1 and 145-2 and the upper electrodes 150-1 and 150-2. In some embodiments, the conformal dielectric layer 170 comprises a dielectric materials such as SiN, SiC, SiCN, SiCH, or any dielectric material which is suitable for use as dielectric sidewall spacers for the MTJ structures 145-1 and 145-2. In some embodiments, the conformal dielectric layer 170 is formed by conformally depositing dielectric material using plasma-enhanced chemical vapor deposition (PECVD), atomic layer deposition (ALD), or other suitable deposition methods which enable the deposition of thin films of dielectric material with high conformality.

Following formation of the conformal dielectric layer 170, an etch process is performed to pattern the conformal dielectric layer 170 and the bottom electrode layer 140 to thereby form sidewall spacers and individual bottom electrodes for the MRAM devices. More specifically, FIG. 6 is a schematic cross-sectional side view of the device shown in FIG. 5 after patterning the conformal dielectric layer 170 and the bottom electrode layer 140 to form dielectric sidewall spacers 171 on sidewalls of the MTJ structures 145-1 and 145-2 and the upper electrodes 150-1 and 150-2, and to form individual bottom electrodes 140-1 and 140-2 below the respective MTJ structures 145-1 and 145-2. In this exemplary embodiment, the interface between the dielectric sidewall spacers 171 and the MTJ structures 145-1 and 145-2 and the upper electrodes 150-1 and 150-2 is completely or substantially free of metallic residue as a result of the cleaning etch process. The etch process results in the formation of an array of individual MRAM devices. For example, for illustrative purposes, FIG. 6 schematically illustrates two MRAM devices D1 and D2, wherein the MRAM device D1 comprises the MTJ structure 145-1 disposed between the bottom and upper electrodes 140-1 and 150-1, and wherein the MRAM device D2 comprises the MTJ structure 145-2 disposed between the bottom and upper electrodes 140-2 and 150-2.

In some embodiments, the patterning process is performed using a dry etch process (e.g., RIE or IBE) to etch down lateral surfaces of the conformal dielectric layer 170 on the upper electrodes 150-1 and 150-2 and the bottom electrode layer 140, and vertically recess exposed portions of the bottom electrode layer 140 down to the third insulating layer 130. For example, in some embodiments, the etch process is performed using an IBE process having the same or similar etch parameters (e.g., ion energy, ion current density, ion incidence angle) as used to ion beam etch the MTJ layer stack 145 (FIGS. 2-3). In other embodiments, the etch process is performed using a RIE (reactive ion etch) process comprising a fluorocarbon-based chemistry or a chlorine-based etch chemistry.

As schematically illustrated in FIG. 6, the etch process results in a slight recess (or thinning) of the upper electrodes 150-1 and 150-2, as well as a slight gouging (etching) of the upper surface of the third insulating layer 130. While it is ideal to terminate the etch process when reaching the upper surface of the third insulating layer 130, an over-etch is performed to ensure that the exposed portions of the bottom electrode layer 140 is completely removed to properly form the individual bottom electrodes 140-1 and 140-2. Since the etch process (e.g., IBE) is non-selective, the over-etch results in slight recessing/gouging of the upper surface of the third insulating layer 130

As further illustrated in FIG. 6, wherein bottom electrodes 140-1 and 140-2 extend below the insulating spacers 171, and the outer vertical sidewalls of the insulating spacers 171 are substantially coplanar with the vertical sidewalls of the bottom electrodes 140-1 and 140-2 that are formed by essentially "cutting" the bottom electrode layer 140 using the dielectric sidewall spacers 171 in conjunction with upper electrodes 150-1 and 150-2 as a "cut mask" to pattern the bottom electrode layer 140.

As further illustrated in FIG. 6, the etch process results in the re-deposition of residual metallic and/or dielectric material 180 on the sidewall spacers 171. In this instance, since the sidewall spacers 171 are formed on the "cleaned" sidewalls of the upper electrodes 150-1 and 150-2 and the MTJ structures 145-1 and 145-2, the sidewall spacers 171 prevent the residual material 180 from being re-deposited on the "cleaned" sidewalls of the upper electrodes 150-1 and 150-2 and the MTJ structures 145-1 and 145-2. This prevents potential shorts between layers of the MTJ structures 145-1 and 145-2 or between the upper electrodes 150-1 and 150-2 and layers of the underlying MTJ structures 145-1 and 145-2, respectively. Moreover, in some embodiments, since the residual material 180 on the sidewall spacers 171 has no adverse effect on the performance of the MRAM devices D1 and D2, no additional IBE cleaning process is needed to remove the residual material 180 from the sidewall spacers 171. In other embodiments, another IBE cleaning process can be performed to remove the residual material 180 from the surfaces of the sidewall spacers 171.

A next stage of the fabrication process comprises forming an insulating layer to encapsulate the MRAM devices D1 and D2 and form upper electrode contacts to the MRAM devices. For example, FIG. 7 is a schematic cross-sectional side view of the device shown in FIG. 6 after forming a fourth insulating layer 190 (e.g., ILD layer) to encapsulate the MRAM devices. In some embodiments, the fourth insulating layer 190 is formed by a process which comprises depositing a layer of insulating material over the substrate surface to cover the MRAM devices D1 and D2, and then planarizing the deposited layer of insulating material to form the fourth insulating layer 190, as shown in FIG. 7. The fourth insulating layer 190 can be formed using the same or similar materials and deposition methods as the first insulating layer 110 and/or the second insulating layer 120, as discussed above.

Next, FIG. 8 is a schematic cross-sectional side view of the device shown in FIG. 7 after forming upper electrode contacts 192 in the fourth insulating layer 190, which are in contact with the upper electrodes 150-1 and 150-2 of the MRAM devices. The upper electrode contacts 192 comprise a metallic via 194 and a liner layer 196. The metallic via 194 can be formed of conductive material such as Ta, TaN, Ti, TiN, Ru, W, etc., or other types of metallic material which is suitable for the given application. The liner layers 196 can be formed using one more layers of material that serve as a diffusion barrier layer and/or seed layer, such as TiN, TaN, Co, etc. The upper electrode contacts 192 are formed using process which comprises, e.g., patterning the fourth insulating layer 190 to etch openings that at least partially expose portions of the underlying upper electrodes 150-1 and 150-2, depositing a conformal liner layer and metallic fill material to line and fill the etched openings, and then performing a CMP process to remove the overburden portions of the liner layer and metallic fill material down to the surface of the fourth insulating layer 190, thereby resulting in the intermediate device structure schematically illustrated in FIG. 8. Thereafter, further BEOL processing is performed to build one or more additional metal levels above the MRAM device layer to complete fabrication of the BEOL structure.

The exemplary methods for fabricating embedded MRAM devices according to embodiments of the invention as discussed provide significant advantages over conventional methods for fabricating embedded MRAM devices. For example, in a conventional process, a single etch process would be performed (e.g., in FIG. 2) to concurrently etch the MTJ layer stack 145 and the bottom electrode layer 140 down to the insulating layer 130 to thereby form the MTJ structures and bottom electrodes. The single etch process would result in etching/gouging of the insulating layer 130 as a result of the over-etch needed to properly etch away the exposed portion of the bottom electrode layer 140 to form the bottom electrodes. With this single etch process, residual metallic material would be re-deposited on the sidewalls of the MTJ structures (as a result of the concurrent etching of the MTJ layer stack 145 and the bottom electrode layer 140), and residual dielectric material would be re-deposited over the residual metallic material on the sidewalls of the MTJ structure (as a result of the etching of the underlying dielectric layer 130).

Further, with a conventional process, the residual metallic and dielectric materials that are re-deposited on the sidewalls of the MTJ structures as a result of the single etch process are removed using a cleaning etch process. However, with the conventional process flow, the cleaning etch process must be performed for a relatively long period of time and at a relatively high power to effectively remove the residual dielectric and metallic material from the sidewalls of the MTJ structures. However, this conventional cleaning etch process would lead to further etching/gouging of the exposed surface of the underlying dielectric layer 130, which can lead to removal of the dielectric material in open areas outside the MRAM array and exposing metallic wiring of a lower interconnect level of the BEOL structure. Therefore, the duration/power of the conventional cleaning etch process must be limited to comply with the specification for the maximum allowable etching/gouging of the underlying dielectric layer to prevent exposure of underlying metallic wiring. In the regard, the conventional cleaning etch process may not sufficiently remove all residual metallic material from the sidewalls of the MTJ structure, thereby ultimately resulting in junction shorts.

In contrast to conventional methods, the MTJ layer stack and the bottom electrode layer are patterned using separate etch processes, with a cleaning process performed between the etch processes. Indeed, as noted above, the MTJ layer stack 145 is patterned using a first etch process (e.g., IBE) to form the MTJ structures 145-1 and 145-2. A cleaning etch process is then performed to completely or substantially remove all residual metallic material which is re-deposited on the sidewalls of the MTJ structures 145-1 and 145-2 as a result of the etching of the MTJ layer stack 145 and the slight etching of the bottom electrode layer 140. In this instance, as compared to the conventional method, no residual dielectric material would be re-deposited over the residual metallic material on the sidewalls of the MTJ structures 145-1 and 145-2 since the underlying dielectric layer 130 is not etched during the etch process to pattern the MTJ layer stack 145. As such, a cleaning etch process according to an exemplary embodiment of the invention can be performed at a lower power and at a reduced duration (as compared to the conventional cleaning process) which is sufficient to fully remove the residual metallic material from the sidewalls of the MTJ structures 145-1 and 145-2.

Moreover, the formation of the conformal dielectric layer 170 following the first etch process prevents oxidation or re-deposition of metallic or dielectric material on the cleaned sidewalls of the MTJ structures 145-1 and 145-2 during the final etch process which is performed to pattern the conformal dielectric layer 170 and the bottom electrode layer 140 to thereby form the dielectric sidewall spacers 171 (on the sidewalls of the MTJ structures 145-1 and 145-2 and the upper electrodes 150-1 and 150-2), and the bottom electrodes 140-1 and 140-2 (as discussed above in conjunction with FIG. 6). During the final etch process, the residual metallic and/or dielectric material (resulting from the etching of the conformal dielectric layer 170, the bottom electrode layer 140, and the slight etching of the insulating layer 130) is re-deposited on the dielectric sidewall spacers 171, and not on the sidewalls of the MTJ structures 145-1 and 145-2.

In this regard, the patterning of the conformal encapsulating layer 170 and the bottom electrode layer subsequent to the cleaning etch process provides significant advantages as compared to conventional MRAM fabrication methods. For example, the bottom electrode layer 140 can be formed relatively thick (e.g., 15 nm or greater) since the residual metallic material that is generated by the etching of the bottom electrode layer 140 is re-deposited on the dielectric sidewall spacers 171 and not the MTJ structures 145-1 and 145-2. In a conventional process, the thickness of the bottom electrode layer would be limited to 15 nm or less to minimize the amount of residual metallic material that would be re-deposited on the MTJ structures as a result of the concurrent etching of the MTJ layer stack and bottom electrode layer.

Furthermore, the etching/gouging of the underlying dielectric layer 130 (as shown in FIG. 6) is limited by the slight over-etch needed during the etch process to pattern the encapsulation layer 170 and lower electrode layer 140. Since no subsequent cleaning etch process is needed to remove the residual metallic/dielectric material that is re-deposited on the surface of the dielectric sidewall spacers 171, the exposed surface of the insulating layer 130 is not subjected to a further etch environment using the exemplary MRAM fabrication methods as discussed herein. This is to be contrasted with the conventional MRAM fabrication process wherein the insulating layer 130 would be subjected to multiple etch processes including the first etch process that is performed to concurrently pattern the MTJ layer stack 145 and the bottom electrode layer 140, and the subsequent cleaning etch process that is performed to remove the residual dielectric/metallic material from the sidewalls of the MTJ structures. As noted above, the exposure of the underlying dielectric layer to such multiple etch processes can lead to unwanted removal of the dielectric material to a level that expose underlying metallic wiring.

It is to be understood that the methods discussed herein for fabricating embedded MRAM devices can be readily incorporated within semiconductor processing flows for fabricating various type of semiconductor IC devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method comprising:
   forming an insulating layer over a substrate;
   forming a bottom electrode layer over the insulating layer;
   forming a magnetic tunnel junction layer stack over the bottom electrode layer;
   forming an upper electrode layer over the magnetic tunnel junction layer stack;
   etching the upper electrode layer to form an upper electrode;
   etching the magnetic tunnel junction layer stack down to the bottom electrode layer to form a magnetic tunnel junction structure with the upper electrode disposed over the magnetic tunnel junction structure;

performing a cleaning etch process to remove residual material which is redeposited on sidewalls of the magnetic tunnel junction structure and the upper electrode, as a result of the etching of the magnetic tunnel junction layer stack;

forming an insulating spacer on the sidewalls of the magnetic tunnel junction structure and the upper electrode, subsequent to performing the cleaning etch process; and etching the bottom electrode layer down to the first insulating layer to form a bottom electrode disposed below the magnetic tunnel junction structure;

wherein the bottom electrode, the magnetic tunnel junction structure, and the upper electrode form a magnetic random-access memory device; and wherein etching the upper electrode layer to form the upper electrode comprises:

forming a lithographic stack over the upper electrode layer, wherein the lithographic stack comprises a hardmask layer formed over the upper electrode layer;

lithographically patterning the lithographic stack to form an etch mask; and performing a first etch process to pattern the upper electrode layer by transferring an image of the etch mask into the upper electrode layer;

wherein the first etch process results in the formation of the upper electrode with a hardmask capping layer disposed over the upper electrode.

2. The method of claim 1, wherein the bottom electrode extends below the insulating spacer.

3. The method of claim 1, wherein etching the magnetic tunnel junction layer stack down to the bottom electrode layer to form the magnetic tunnel junction structure comprises:

performing a second etch process to pattern the upper electrode layer by transferring an image of the upper electrode and the hardmask capping layer into the magnetic tunnel junction layer stack to form the magnetic tunnel junction structure with the upper electrode disposed over the magnetic tunnel junction structure;

wherein the hardmask capping is removed as a result of the second etch process.

4. The method of claim 3, wherein an exposed portion of the bottom electrode layer is partially recessed as a result of the second etch process, and wherein the upper electrode is partially recessed as a result of the second etch process.

5. The method of claim 3, wherein the second etch process comprises an ion beam etch process.

6. The method of claim 5, wherein the ion beam etch process is performed with an ion incidence angle in a range of about 30° to about 60°.

7. The method of claim 3, wherein forming the insulating spacer on the sidewalls of the magnetic tunnel junction structure and the upper electrode comprises depositing a conformal dielectric layer which conformally covers the magnetic tunnel junction structure, the upper electrode, and the exposed surface of the bottom electrode layer, subsequent to performing the cleaning etch process; and wherein etching the bottom electrode layer down to the first insulating layer to form the bottom electrode disposed below the magnetic tunnel junction structure comprises performing a third etch process to vertically etch down the conformal dielectric layer and the exposed surface of the bottom electrode layer to thereby form the insulating spacer and the bottom electrode.

8. The method of claim 7, wherein the conformal dielectric layer comprises one of silicon nitride, silicon carbide, silicon carbon nitride, and silicon carbon hydrogen (SiCH).

9. The method of claim 7, wherein the third etch process comprises an ion beam etch process which is performed with an ion incidence angle in a range of about 30° to about 60°.

10. The method of claim 7, wherein the third etch process comprises a reactive ion etch process comprising one of a fluorocarbon-based chemistry and a chlorine-based etch chemistry.

11. The method of claim 1, wherein performing the cleaning etch process to remove the residual material on the sidewalls of the magnetic tunnel junction structure and the upper electrode comprises performing an ion beam etch process with an ion incidence angle of about 60° or greater to etch away the residual material.

12. The method of claim 1, further comprising:

forming a first electrode contact in the first insulating layer, prior to forming the bottom electrode layer, wherein the first electrode contact is aligned to, and in contact with, the bottom electrode;

forming a second insulating layer which encapsulate the magnetic random-access memory device; and forming a second electrode contact in the second insulating layer, wherein the second electrode contact is aligned to, and in contact with, the upper electrode.

13. A method comprising:

forming an insulating layer over a substrate;

forming a bottom electrode layer over the insulating layer;

forming a magnetic tunnel junction layer stack over the bottom electrode layer;

forming an upper electrode layer over the magnetic tunnel junction layer stack;

etching the upper electrode layer to form an upper electrode;

etching the magnetic tunnel junction layer stack down to the bottom electrode layer to form a magnetic tunnel junction structure with the upper electrode disposed over the magnetic tunnel junction structure;

performing a cleaning etch process to remove residual material which is redeposited on sidewalls of the magnetic tunnel junction structure and the upper electrode, as a result of the etching of the magnetic tunnel junction layer stack;

forming an insulating spacer on the sidewalls of the magnetic tunnel junction structure and the upper electrode, subsequent to performing the cleaning etch process;

etching the bottom electrode layer down to the first insulating layer to form a bottom electrode disposed below the magnetic tunnel junction structure; and performing a second cleaning etch process to remove residual material which is redeposited on sidewalls of the insulating spacer as a result of the etching of the bottom electrode layer to form the bottom electrode;

wherein the bottom electrode, the magnetic tunnel junction structure, and the upper electrode form a magnetic random-access memory device.

14. The method of claim 13, wherein the bottom electrode extends below the insulating spacer.

15. The method of claim 13, wherein etching the upper electrode layer to form the upper electrode comprises:

forming a lithographic stack over the upper electrode layer, wherein the lithographic stack comprises a hardmask layer formed over the upper electrode layer;

lithographically patterning the lithographic stack to form an etch mask; and performing a first etch process to pattern the upper electrode layer by transferring an image of the etch mask into the upper electrode layer;
wherein the first etch process results in the formation of the upper electrode with a hardmask capping layer disposed over the upper electrode.

16. The method of claim 13, wherein etching the magnetic tunnel junction layer stack down to the bottom electrode layer to form the magnetic tunnel junction structure comprises:
performing a second etch process to pattern the upper electrode layer by transferring an image of the upper electrode and the hardmask capping layer into the magnetic tunnel junction layer stack to form the magnetic tunnel junction structure with the upper electrode disposed over the magnetic tunnel junction structure;
wherein the hardmask capping is removed as a result of the second etch process.

17. The method of claim 16, wherein an exposed portion of the bottom electrode layer is partially recessed as a result of the second etch process, and wherein the upper electrode is partially recessed as a result of the second etch process.

18. A method comprising:
forming an interlayer dielectric layer over a substrate;
forming a first electrode contact in the interlayer dielectric layer;
forming a magnetic random-access memory layer stack over the interlayer dielectric layer, wherein the magnetic random-access memory layer stack comprises: (i) a bottom electrode layer disposed over the interlayer dielectric layer; (ii) a magnetic tunnel junction layer stack disposed over the bottom electrode layer; and (iii) an upper electrode layer disposed over the magnetic tunnel junction layer stack;
performing a first etch process to etch the upper electrode layer down to the magnetic tunnel junction layer stack and thereby form an upper electrode;
performing a second etch process to etch the magnetic tunnel junction layer stack down to the bottom electrode layer and thereby form a magnetic tunnel junction structure with the upper electrode disposed over the magnetic tunnel junction structure;
performing a cleaning etch process to remove residual material which is redeposited on sidewalls of the magnetic tunnel junction structure and the upper electrode, as a result of the second etch process;
depositing a conformal dielectric layer which conformally covers the magnetic tunnel junction structure, the upper electrode, and an exposed surface of the bottom electrode layer, subsequent to performing the cleaning etch process; and
performing a third etch process to etch the conformal dielectric layer and the exposed surface of the bottom electrode layer down the interlayer dielectric layer to thereby form an insulating spacer and a bottom electrode, wherein the insulating spacer is disposed on sidewalls of the magnetic tunnel junction structure and the upper electrode, and wherein the bottom electrode is aligned to, and in contact with, the first electrode contact;
wherein the bottom electrode, the magnetic tunnel junction structure, and the upper electrode form a magnetic random-access memory device; and
wherein the first etch process is performed by a process which comprises:
forming a lithographic stack over the upper electrode layer, wherein the lithographic stack comprises a hardmask layer formed over the upper electrode layer;
lithographically patterning the lithographic stack to form an etch mask; and
performing the first etch process to pattern the upper electrode layer by transferring an image of the etch mask into the upper electrode layer, wherein the first etch process results in the formation of the upper electrode with a hardmask capping layer disposed over the upper electrode; and
the second etch process is performed by a process which comprises performing an ion beam etch process to pattern the upper electrode layer by transferring an image of the upper electrode and the hardmask capping layer into the magnetic tunnel junction layer stack to form the magnetic tunnel junction structure with the upper electrode disposed over the magnetic tunnel junction structure, wherein the hardmask capping is removed as a result of the second etch process.

19. The method of claim 18, wherein:
the first interlayer dielectric layer comprises one of silicon nitride, silicon carbide, silicon carbon nitride, and silicon carbon hydrogen; and
the conformal dielectric layer comprises one of silicon nitride, silicon carbide, silicon carbon nitride and silicon carbon hydrogen.

20. The method of claim 18, wherein performing the cleaning etch process to remove the residual material on the sidewalls of the magnetic tunnel junction structure and the upper electrode comprises performing an ion beam etch process with an ion incidence angle of about 60° or greater to etch away the residual material.

* * * * *